(12) United States Patent
Kerschaver et al.

(10) Patent No.: US 6,384,317 B1
(45) Date of Patent: May 7, 2002

(54) SOLAR CELL AND PROCESS OF MANUFACTURING THE SAME

(75) Inventors: Emmanuel Van Kerschaver, Knokke-Heist; Jozef Szlufcik, Kessel-Lo; Roland Einhaus, Winksele; Johan Nijs, Linden-Lubbeek, all of (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 09/445,099
(22) PCT Filed: May 29, 1998
(86) PCT No.: PCT/BE98/00077
§ 371 Date: Apr. 3, 2000
§ 102(e) Date: Apr. 3, 2000
(87) PCT Pub. No.: WO98/54763
PCT Pub. Date: Dec. 3, 1998

(30) Foreign Application Priority Data

May 30, 1997 (EP) .............................................. 97870081

(51) Int. Cl.⁷ ...................... H01L 31/0224; H01L 31/18
(52) U.S. Cl. ........................ 136/256; 136/244; 136/255; 257/461; 257/465; 257/466; 257/437; 438/80; 438/98; 438/72; 438/81
(58) Field of Search ..................... 136/256, 244, 136/255; 257/461, 465, 466, 437; 438/80, 98, 72, 81

(56) References Cited

U.S. PATENT DOCUMENTS

| | | | | |
|---|---|---|---|---|
| 3,903,428 A | * | 9/1975 | DeJong | 136/244 |
| 4,104,091 A | * | 8/1978 | Evans, Jr. et al. | 438/57 |
| 5,468,652 A | * | 11/1995 | Gee | 136/256 |
| 5,595,607 A | * | 1/1997 | Wenham et al. | 136/244 |

FOREIGN PATENT DOCUMENTS

| | | | |
|---|---|---|---|
| JP | 63-211773 A | * | 9/1988 |
| JP | 2-51282 A | * | 2/1990 |

* cited by examiner

Primary Examiner—Alan Diamond
(74) Attorney, Agent, or Firm—Knobbe Martens Olson & Bear LLP

(57) ABSTRACT

The solar cell in the semiconductor substrate includes at least a radiation receiving front surface and a second surface. The substrate includes a first region of one type of conductivity and a second region of the opposite conductivity type with at least a first part located adjacent to the front surface and a second part located adjacent to the second surface. The front surface includes conductive contacts to the second region and the second surface has separated contacts to the first region and to the second region. The contacts to the second region at the second surface are connected to the contacts at the front surface through a limited number of vias.

21 Claims, 5 Drawing Sheets

SOLAR CELL AND PROCESS OF MANUFACTURING THE SAME

FIELD OF THE INVENTION

The present invention is related to solar cells.

The present invention is also related to a cost-effective process of realization of solar cells.

TECHNOLOGICAL BACKGROUND

Most solar cells described in the prior art can be subdivided into several categories according to their general structure.

One of these categories is the group of the so-called back-contacted solar cells, meaning that both ohmic contacts to the two oppositely doped regions of the solar cells are placed on the back or non-illuminated surface of the solar cell. This concept avoids shadowing losses caused by the front metal contact grid on standard solar cells.

The most straightforward way to fabricate back contact solar cells is to place the carrier collecting junction between semiconductor regions of opposite doping close to the back surface of the cell ("back-junction" cell). The document "27.5-Percent Silicon Concentrator Solar Cells" (R. A. Sinton, Y. Kwark, J. Y. Gan, R. M. Swanson, IEEE Electron Device Letters, Vol. ED-7. No. 10, October 1986) describes such a device.

Since the majority of photons are always absorbed close to the front surface of the cell, the generated carriers in these regions have to diffuse through the entire base region of the cell towards the carrier collecting junction close to the back surface. For this concept, high quality material with minority carrier diffusion lengths longer than the cell thickness is needed, which makes this solution not applicable for most solar grade materials which generally have short diffusion lengths. Additionally, a perfect front surface passivation is required for cells having the carrier collecting junction close to the back surface.

The largest group of solar cells has the carrier collecting junction close to its front surface. The current from these solar cells is collected by a metal contact to the doped region on the front surface and by a second contact to the oppositely doped region on the back surface. Although this front grid structure can be optimized relatively easily in order to get high collection efficiencies, the trade off between resistance losses and shading losses necessitates a coverage of the front surface by 10–15% of the total area.

Another group of solar cells combines the two approaches. Such solar cells have both external contacts to the oppositely doped regions on the back surface and the collecting junction close to the front surface. The collected current from the front surface is lead through openings, which extend through the entire wafer, to the back surface. Using this structure, shading losses normally arising from the front metallization grid are greatly reduced.

Several patents make use of this approach.

Documents U.S. Pat. Nos. 4,227,942 and 4,427,839 disclose solar cell structures in which the metal contacts to both oppositely doped regions are placed on the back surface of the device. The connection to the front carrier collecting junction is realized by chemically etched vias which are arranged in an array. The metal grids and chemical etch mask are defined by photolithography. Photolithography, however, is an expensive processing step and difficult to implement into industrial solar cells production.

The document U.S. Pat. No. 4,838,952 discloses a similar structure wherein an array of holes is created with photo-lithographically defined areas using chemical etching. In this case, the holes do not extend from the top surface to the back surface of the device. They only extend from the back surface to the junction region. Due to the lower doping density at the junction region compared to the surface where the contacts are normally placed, the contact resistance is expected to be higher with this device if industrial metallization techniques such as screen printing are used. The disadvantages of photolithography also apply to this method.

The document U.S. Pat. No. 3,903,427 also describes a solar cell with an array of holes, machined by mechanical, electron beam or laser drilling, in order to lead the collected current from the front surface of the solar cell to the back surface. In this case, the metal contacts to the regions of opposite polarity are placed on the back surface, one above the other separated by a dielectric layer. This device makes it also necessary to have an insulating dielectric layer along the walls of the holes. This layer is difficult to combine with industrial metallization techniques such as screen printing metal paste and firing the metal paste which dissolves dielectric layers.

The document U.S. Pat. No. 4,626,613 discloses solar cells with both contacts on the back surface and an array of holes connecting front and back surface. The holes are used for conducting current from the front surface to the metal grid on the back surface of the appropriate polarity. The holes are machined by laser drilling or by scribing a set of parallel spaced grooves on the front and rear surface. The two sets of grooves on both surfaces are oriented perpendicularly so that after an appropriate etching process, holes are revealed at the points of intersection.

A similar structure is shown in U.S. Pat. No. 5,468,652, wherein the cell structure uses an array of laser drilled holes to conduct current collected on the front surface to the back surface where the metal contacts to the oppositely doped regions are placed. Although this latter case offers also some simplifications to cell processing compared to the ones suggested hereabove, there are still some common drawbacks of cell structures which make use of a large number of holes for electrically connecting the two surfaces of a cell.

In order to avoid resistive losses caused by current crowding effects within the heavier doped surface layer of the cell around the holes, the holes need to be spaced 1–1.5 mm to each other in both dimensions. On large area solar cells (10×10 cm$^2$) a total number of more than 10000 holes would be necessary. Other difficulties arise from the metallization point of view. The close spacing of holes demands very narrow alignment tolerances for the two metal grids on the back surface. The large number of holes associated with the structures disclosed in the patents listed above makes these cell structures expensive and not well suited for mass production.

The document U.S. Pat No. 3,903,428 discloses a solar cell structure that uses one centrally located hole in combination with a metal grid on the cell's front surface to lead the collected current from the front to the back surface. The disclosed structure is best suited for round devices of small area due to increased resistive losses caused by current crowding round the centrally located hole. U.S. Pat. No. 3,903,428 also does not allow a second collecting junction to be placed on the back surface of the cells which would be possible with some of the structures discussed above.

The document JP-63-211773-A describes a solar cell structure where removing the external contact from the front surface increases the active area and makes both polarity contacts accessible from the back surface. Incident light generates electron-hole pairs in the bulk of the structure. Excess minority carriers diffuse towards the collecting junction formed by epitaxial growth at the front surface. Once they crossed the junction they can diffuse as majority carriers towards a metal contact, which is part of a conduction path towards external contacts at the back surface of the cell. The conduction path between the front and back surface is foreseen through a limited number of holes. The diffusion of the minority carriers through the whole wafer makes this approach difficult to use for lower quality materials. The distance a minority carrier can diffuse through the bulk region before it recombines is limited by the material quality. For high quality material, minority carriers can travel several times the base width before recombining. However, the diffusion length in low-grade material can be lower than the cell structure. In this case, carriers generated deep within the structure have a small chance to reach the front surface where they can be collected.

AIMS OF THE PRESENT INVENTION

The present invention aims to suggest the realization of a solar cell structure suitable for solar grade materials that overcomes the limitations of the above mentioned structures of the state of the art while maintaining industrial applicability.

The present invention aims to suggest a cost-effective process of realization of solar cells.

MAIN CHARACTERISTICS OF THE PRESENT INVENTION

The first object of the present invention is to suggest a solar cell in a semiconductor substrate comprising at least a radiation receiving front surface and a second surface, said substrate comprising a first region of one type conductivity, and a second region of the opposite conductivity type with at least a first part located adjacent to the front surface and with at least a second part located adjacent to the second surface, said front surface having conductive contacts to said second region and said second surface having separated contacts to said first region and to said second region, wherein the contacts to said second region at the second surface are connected to the contacts at the front surface through a limited number of vias.

With a limited number of vias, it is meant a number of vias that can be fabricated in an industrially feasible (short enough) time frame. Thus, the number of vias is about 100 or lower for a 10×10 cm$^2$ solar cell, for instance of the order of 10–20.

If said second surface is the back surface of the substrate, separated contacts to said first region and said second region are created on the back surface.

The second region is defined by the doped region of the substrate and can be either of n-type or p-type while the first region is then of p-type or n-type.

Preferably, the vias extend from the front surface to the back surface of the substrate and are cone shaped or cylindrical shaped.

The conductive contacts on the front surface are formed by a number of narrow metal lines, each part of a conductive path towards at least one via opening on the front surface.

Both contacts at the back surface serve as external contacts for the device. The contact to the second region at the back surface serves to pick up and transport carriers collected at the front junction between the regions by means of the connection to the contact at the front surface through the vias, and additionally to pick up and transport the carriers collected at the junction close to the back surface.

A second object of the present invention is to suggest a process of realization of a solar cell consisting essentially in a semiconductor substrate having a first region of one conductivity type and a second region of the opposite conductivity type, said substrate being defined by a front surface intended to receive the radiation and a second surface intended to receive contacts to the first region and the second region, said process comprising at least the following steps:

machining a number of vias through the substrate;
chemically etching said vias;
introducing phosphorous or any other dopand in the substrate including the walls of the vias in order to create a second region;
forming contacts to both first region and second region of the solar cell, said contacts comprising at least contacts to the second region on the front surface and external contacts being on the second surface;
metallizing the vias in a way that the metallization forms a conduction path between the contacts to the second region on the front surface and at least one of the external contacts on the second surface.

Preferably, the steps of forming the contacts and metallizing the vias can be performed substantially simultaneously.

The introduction of a dopand into the substrate can be done e.g. by diffusion, ion implantation of a dopand into the substrate.

The formation of metal contacts can be for example by screen printing and firing, evaporation and/or any other technique of deposition of metal.

DETAILED DESCRIPTION OF PREFERRED EMBODIMENTS OF THE INVENTION

The present solar cell can be described as a parallel connection of two diodes, forming a back contacted double junction solar cell. The current collected by metal fingers at the front surface of the cell is lead to an external contact at its back surface through a limited number of vias. A junction present at the back surface will increase the collection volume of generated carriers, thus increasing the output current of the device.

Figure 1:
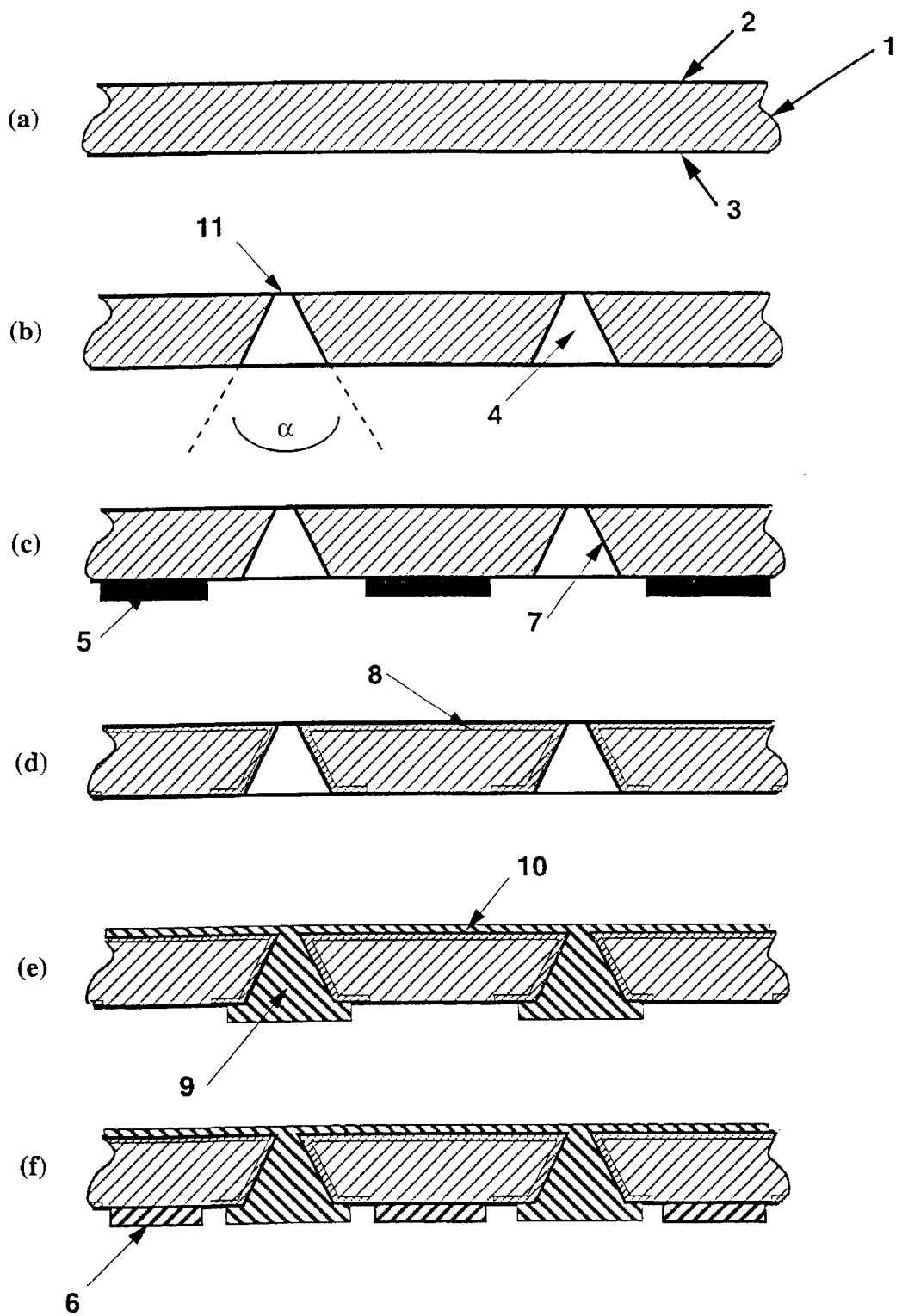
FIGS. 1a–f represent an isometric cross section of a cell at different processing stages of the process of realization.

In the following description, a method to produce solar cells with homogeneous emitters is disclosed with reference to FIG. 1.

The processing sequence for a back-contacted solar cell with a double junction is according to a preferred embodiment as follows:

The starting material is a p-type substrate 1 having a front surface 2 and a back surface 3 as represented on FIG. 1a.

On FIG. 1b, a number of vias 4 are machined through the substrate. By using a suitable technique, the opening angles α of the vias can be varied. Possible techniques for machining holes with an angle α=0° include mechanical drilling and spark erosion. These techniques are also suitable for creating cylindrical holes (α=0°). In addition, laser drilling, water jet drilling, electron beam drilling or ultrasonic drilling can also create cylindrical holes. Chemical etching can also be used but in this case the definition of the openings with a mask is always necessary which makes this technique unsuitable for industrial application.

Implementing cone shaped vias (with an opening angle α>0°) makes it easier to apply commercial manufacturing techniques like screen printed metallization as will be described hereunder. The vias can either extend through the whole substrate 1 from the back 3 to the front surface 2 or extend only to a short distance (<25 μm) from the front surface 2 of the substrate 1. Next, a chemical etching step is performed in order to remove the damaged surface layer resulting from wafer sawing and via machining. If the vias 4 were not extending up to the front surface 2, sufficient material should be etched off from the front surface 2 to create the via openings 11 in the front surface 2.

Following this step, n-type emitter regions 8 should be formed on both surfaces of the cells, including the walls of the vias 7 as represented in FIG. 1d. The main substrate body of the cell remains bulk p-type silicon. Light generated carriers will diffuse towards the junctions formed between the n-type emitter regions and the p-type bulk, where they are collected. Moreover, the n-type emitter in the walls of the holes also assures electrical isolation between the p-type bulk of the substrate and the n-type contact through the hole.

Possible techniques to form an n-type emitter include:
(1°) Screen printing a phosphorous containing paste on the areas of the cell where an emitter should be created, drying the paste and using a high temperature furnace step to carry out the diffusion itself from the formed phosphorsilicate glass (PSG) into the surface region of the substrate.
(2°) Using a gaseous source like $POCl_3$ in order to create a PSG on the surface of the substrate from which the diffusion into the surface region is carried out.
(3°) Spin-on and spray-on deposition techniques.
(4°) Other techniques like ion implantation would also be possible but not at an industrial level.

At the back surface, a contact to the p-type bulk region has to be foreseen. A significant problem arising from solar cell processes like the one described is the isolation between the p-type and the n-type contacts in order to avoid shunt conductances. Therefore, parts of the back surface should be without n-type emitter or, the n-type emitter region should only be formed selectively. Available techniques range from excluding parts of the back surface from diffusion by applying a suitable masking layer as illustrated in FIG. 1c, to removing the n-type emitter region after diffusion in the areas foreseen for the p-type bulk contact.

Finally the metal contacts are applied to the solar cell. This can be realized by using well known metallization techniques such as screen printing techniques. Screen printing allows the combination of forming the n-type contact at the back surface and metallizing of the vias 4. The vias should be metallised in a way that the metal forms at least a conduction path betweenthe n-type contacts at the front and back surface. Optionally, the vias are metallized in such a way that the metal fills them completely extending up to the front surface as represented on FIG. 1e.

Figure 2:
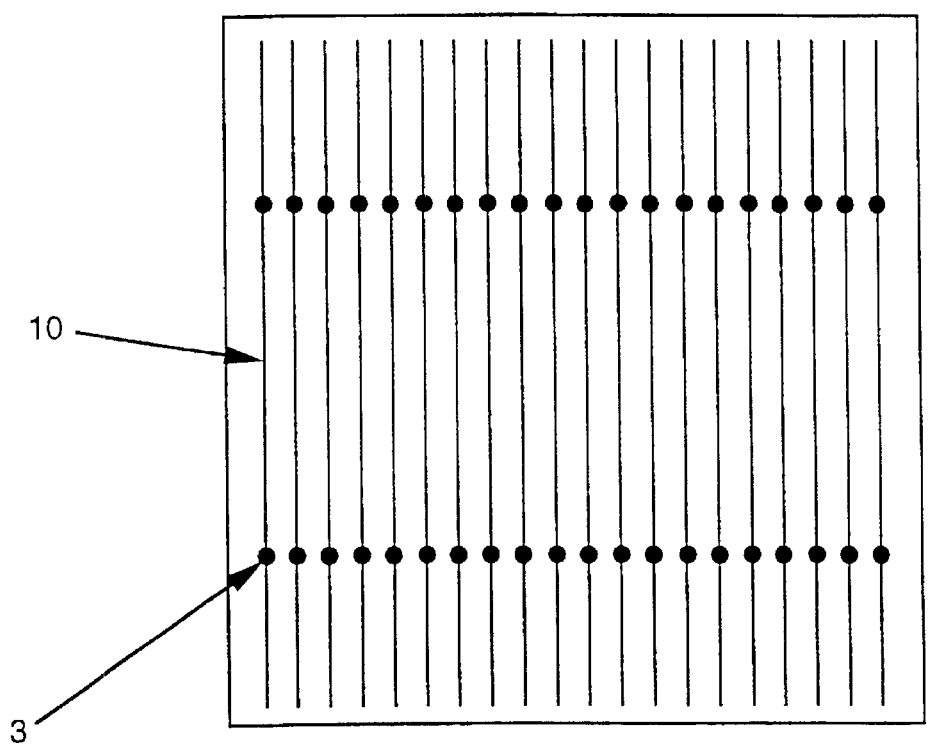
FIGS. 2 & 3 show possible metal grid concepts for the front surface metallization.

An n-type metal contact 10 is formed on the front surface 2 of the cell in such a way that contact to the already metallized vias is formed as represented on FIG. 1f. This n-type contact on the front surface consists of narrow metal fingers, each part of a conductive path towards at least one via opening on the front surface as represented on FIGS. 2 and 3.

The p-type contact to the cell is formed on the back surface resulting in a second grid of metal lines 6 on the back surface separated from abovementioned n-type contact on the back surface. Applying the metal contacts can be realized in any order.

Based on the most essential process sequence as described hereabove, further processing steps known to the man skilled in the art can be added in order to further improve the performance of the cells:
(1°) Following the etching step after the via formation, a surface structuring step can be included. The aim of surface structuring is to reduce the reflection from the front surface of the cell which allows more light to enter the cell and thus leads to a higher current output of the cell. Several techniques for surface structuring are known to the man skilled in the art.
(2°) In order to passivate the surfaces of the cell, an oxidation can be carried out after the emitter diffusion step. The resulting $SiO_2$ layer does not form any barrier for the application of metal contacts to the silicon. Techniques to contact the silicon through the oxide with metal grids are well established.
(3°) The front surface of the solar cell may be covered with an anti-reflection coating (ARC) layer in order to further reduce the reflection losses.

Figure 3:
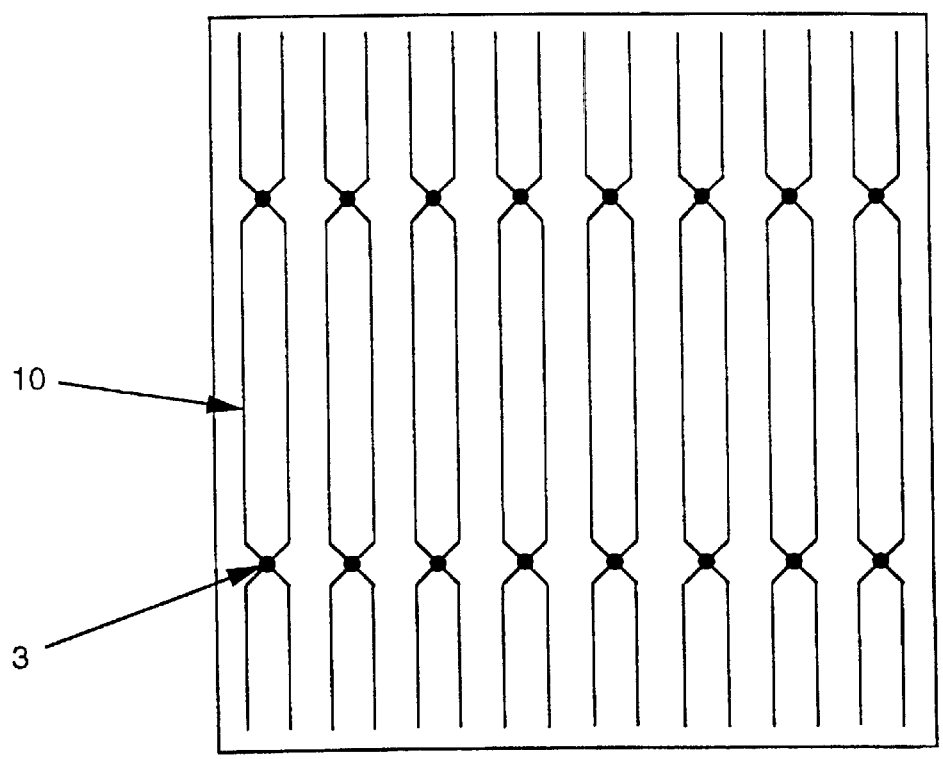

The following are possible implementations of the front metal grid described hereabove:
(1°) The number of vias does not have to correspond to the number of fingers. A design where more than one finger is connected to one via can be realized as shown in FIG. 3. An advantage of this layout is a further reduction of the total number of vias which can speed up the manufacturing processing of holes.
(2°) Different front contact grids other than parallel fingers can also be combined with vias to lead the collected current to the back surface.
(3°) The vias do not necessarily have to be placed along two lines. Alternative placements of the vias corresponding to the front metallization are a design option as well.

The disclosed solar cell structure according to the present invention can also be used for cells with selective emitters. In cells with selective emitters, the dopand concentration adjacent to the metal contact is higher than in the open areas of the cells that receive the incident light.

Instead of using p-type substrates as starting material it is also possible to apply the above mentioned processing steps to n-type substrates with corresponding reversals of following regions in a cell of certain conductivity compared to the descriptions hereabove.

Figure 4:
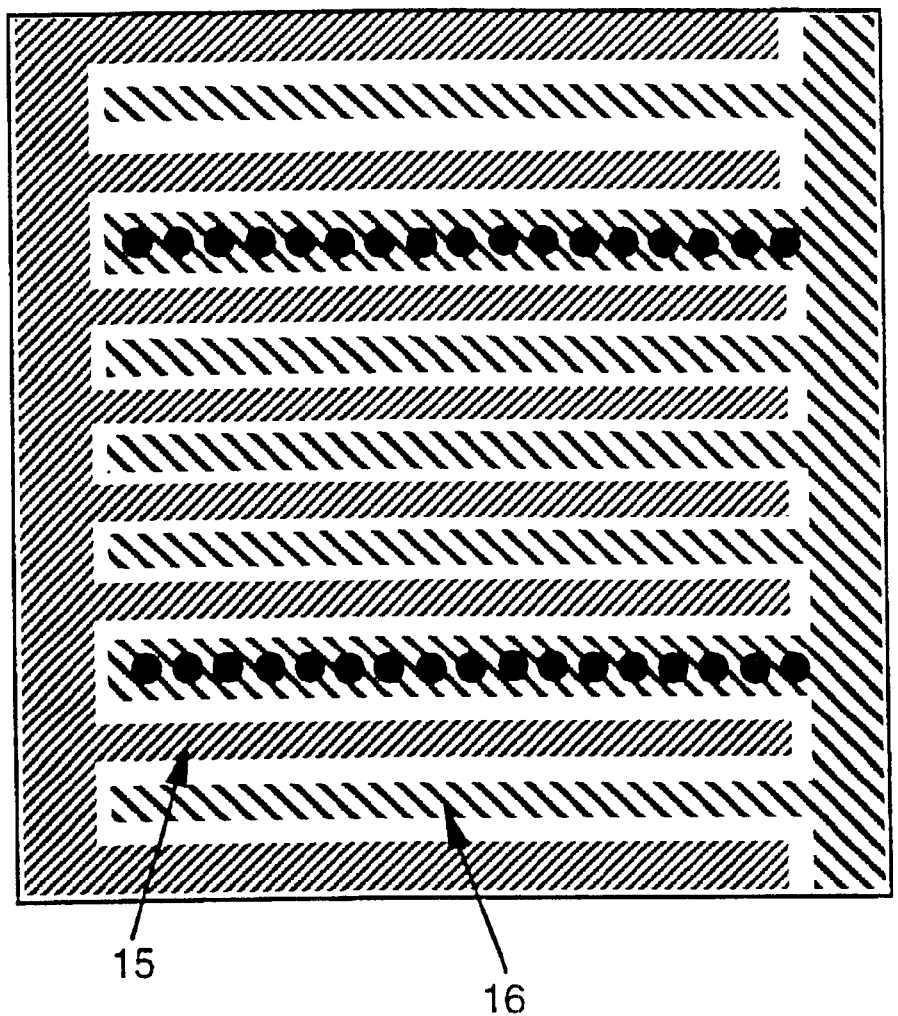
FIG. 4 shows possible metal contacting schemes on the back surface of a solar cell according to preferred embodiments of the present invention.

FIG. 4 gives an example of a back surface metallization design. The emitter on the back surface of the cell and the substrate body is contacted and the junction is used as a second carrier collecting junction in addition to the first collecting junction on the front surface. This design results in an interdigitated structure consisting of contact fingers to the bulk 15 and contact fingers to the back surface emitter 16.

Figure 5:
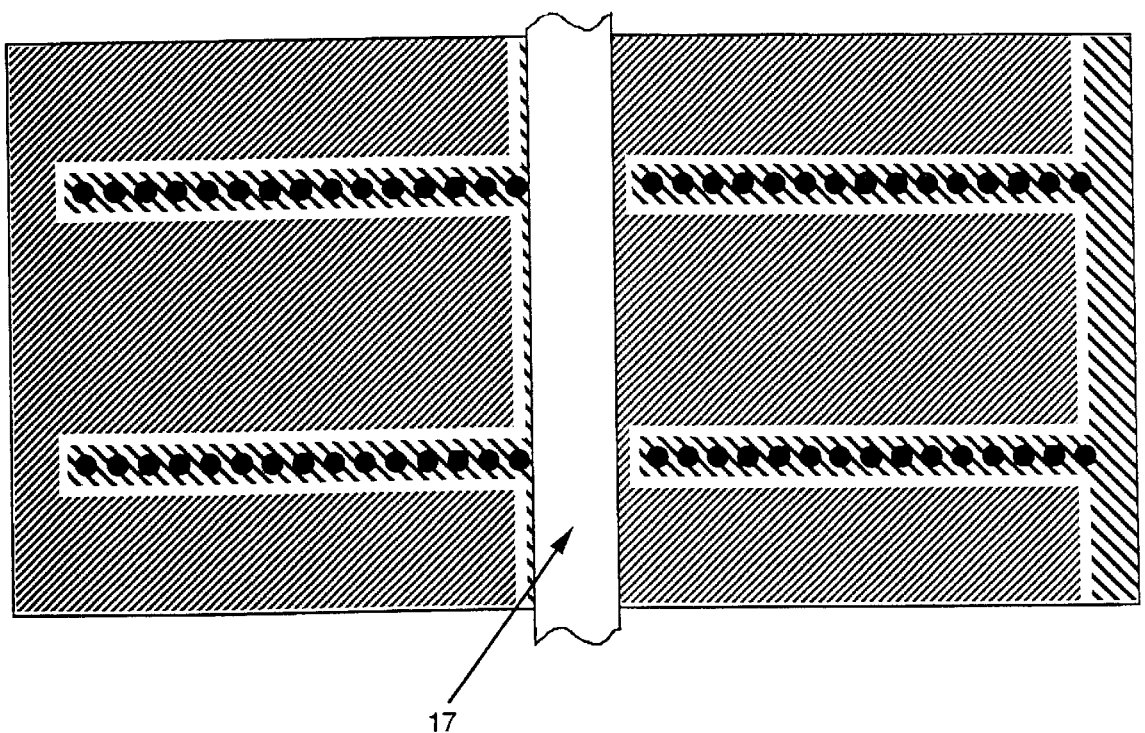
FIG. 5 shows the series connection of two solar cells on their back surfaces according to a preferred embodiment of the present invention.

Back metallization structures like the one described offer the possibility of easy electrical interconnection between single solar cells. As an example, FIG. 5 shows the series connection between two cells that can be realized by placing the cells next to each other, with the n-type connector at the edge of the first cell adjacent to the p-type connector at the edge of the second cell. The electrical connection can be easily established by applying a wide conductive lead 17 over both connectors. This way of cell interconnection gives rise to a dense packing of cells in a module and is much more simplified than the connection of conventional cells for which it is necessary to lead a connecting wire from the front surface of one cell to the back surface of the next cell.

What is claimed is:

1. A solar cell comprising:
a semiconductor substrate of a material wherein the diffusion length of minority carriers is lower than at least one of the dimensions of the substrate, said substrate comprising at least a radiation receiving front surface and a second surface, said substrate comprising a first region of one type conductivity, and a second region of the opposite conductivity type with at least a first part of said second region located over at least a part of the front surface and with at least a second part of said second region located over at least a part of the second surface, said front surface having conductive contacts to said second region and said second surface having separated contacts to said first region and to said second part of said second region wherein said second part of said second region is extending adjacent to the second surface beyond the contact area of the contacts to said second part of said second region and wherein the contacts to said second region at the second surface are connected to the contacts at the front surface through a limited number of vias.

2. A solar cell according to claim 1, wherein the second surface is the back surface on which separated external contacts to said first region and said second region are present and said at least one of the dimensions is the thickness of the substrate.

3. A solar cell according to claim 1, wherein the first region of the substrate is of p-type while the second region is of the n-type.

4. A solar cell according to claim 1, wherein the first region of the substrate is of n-type while the second region is of the p-type.

5. A solar cell according to claim 1, wherein the vias extend from the front surface to the second surface of the substrate.

6. A solar cell according to claim 1, wherein the vias are cone shaped or cylindrical shaped vias.

7. A solar cell according to claim 1, wherein the conductive contacts on the front surface comprise a number of narrow metal fingers, each part of a conductive path towards at least one via opening on the front surface.

8. A solar cell according to claim 7, wherein the number of narrow metal fingers is more than the number of vias in one row of vias.

9. A solar cell according to claim 8, wherein said conductive contacts of the front surface consist of a number of parallel spaced fingers whose total number matches exactly the number of vias in one row of vias.

10. A solar cell according to claim 1, wherein the number of vias is less than 100 for cells having an area smaller than about 10 cm×10 cm.

11. A solar cell according to claim 1, wherein an anti-reflection coating layer is deposited on the front surface.

12. A process for preparing a solar cell in a semiconductor substrate of a material wherein the diffusion length of minority carriers is lower than at least one of the dimensions of the substrate, said substrate having a first region of one conductivity type and a second region of the opposite conductivity type, said substrate being defined by a first surface intended to receive radiation and a second surface intended to receive contacts to the first region and the second region, said process comprising:
machining a number of vias through the substrate;
chemically etching said vias;
introducing a dopand in the substrate including the walls of the vias and further extending over at least a part of said first surface and said second surface in order to create a second region;
forming contacts to both the first region and the second region of the solar cell, said contacts comprising at least contacts to the second region on the front surface and external contacts being on the second surface, said part of said second surface having said dopand extending beyond the contact area of the contacts to said second region; and
metallizing the vias in a way that the metallization forms a conduction path between the contacts to the second region on the front surface and at least one of the external contacts on the second surface.

13. A process for preparing a solar cell according to claim 12, wherein forming the contacts and metallizing the vias are performed substantially simultaneously.

14. A process for preparing a solar cell according to claim 12, further comprising:
depositing a masking layer on the second surface of the substrate;
diffusing the dopand into a not covered surface by the mask of the substrate including the walls of the vias in order to create said second region; and
removing the mask after the step of diffusing the dopant into the substrate.

15. A process according to claim 12, wherein in the case that the vias are not extending from the second surface up to the front surface, sufficient material of the substrate is etched off from the front surface in order to create via openings on the front surface.

16. A process according to claim 12, wherein the semiconductor substrate is silicon and wherein phosphorous diffusion is performed by screen printing a phosphorous containing paste on the areas of the cell where an emitter should be created, drying the paste and using a high temperature furnace to carry out the diffusion itself from the formed phosphorsilicate glass (PSG) into the surface region of the substrate.

17. A process according to claim 12, wherein the semiconductor substrate is silicon and wherein phosphorous diffusion is performed by using a gaseous source in order to create a PSG on the surface of the substrate from which the diffusion into the surface region is carried out.

18. A process according to claim 12, wherein phosphorous diffusion is performed by spin-on or spray-on deposition techniques.

19. A process according to claim 12, wherein phosphorous diffusion is performed by an ion implantation technique.

20. A process according to claim 14, wherein the removal of the mask is achieved by submerging the substrate in dilute HF followed by a two-step cleaning sequence with chemical solutions where the mask is oxidized by an oxidizing agent followed by its removal in diluted HF.

21. A process according to claim 12, wherein forming contacts is performed by screen printing techniques.

* * * * *